(12) United States Patent
Asano et al.

(10) Patent No.: US 6,885,596 B2
(45) Date of Patent: Apr. 26, 2005

(54) APPARATUS AND METHOD OF WORDLINE/ BITLINE REDUNDANCY CONTROL USING SHIFT REGISTERS IN AN SRAM

(75) Inventors: Toru Asano, Omihachiman (JP); Sang Hoo Dhong, Austin, TX (US); Takaaki Nakazato, Austin, TX (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 10/606,584

(22) Filed: Jun. 26, 2003

(65) Prior Publication Data

US 2004/0264265 A1 Dec. 30, 2004

(51) Int. Cl.[7] ............................................. G11C 29/00
(52) U.S. Cl. .............. 365/200; 365/189.12; 365/230.06
(58) Field of Search ............................ 365/200, 189.12, 365/230.06, 230.04

(56) References Cited

U.S. PATENT DOCUMENTS 6,363,020 B1 * 3/2002 Shubat et al. ............... 365/200

* cited by examiner

*Primary Examiner*—David Lam
(74) *Attorney, Agent, or Firm*—Carr LLP; Robert M. Carwell

(57) ABSTRACT

A decoder for use in wordline/bitline redundancy control is disclosed. In one aspect, the decoder includes first and second wordlines respectively coupled to redundant first and second wordlines, where the first and second wordlines are configured to be activated based on decoded first and second addresses. In addition, the decoder includes first and second shift registers respectively coupled to the redundant first and second wordlines, where each is configured to respectively activate the redundant first and second wordlines when the first or second wordlines contain a defect. In addition, a method of selecting wordlines for use in wordline/bitline redundancy control and a wordline decoder having redundancy control capabilities are also disclosed.

20 Claims, 2 Drawing Sheets

APPARATUS AND METHOD OF WORDLINE/BITLINE REDUNDANCY CONTROL USING SHIFT REGISTERS IN AN SRAM

TECHNICAL FIELD OF THE INVENTION

This invention relates generally to memory systems, and, more particularly, to wordline/bitline redundancy control in memory modules.

BACKGROUND OF THE INVENTION

Modern processors often access memory modules using addresses. Such memory modules include L1 and L2 caches, as well as Static Random Access Memory (SRAM) modules. These addresses are employed to activate certain wordlines, which allow conductivity between activated or deactivated cells within subarrays and bitlines coupled thereto. Conventional decoders typically include an initial decode stage (or "predecode" stage), as well as a final decode stage where the decoded addresses are used to activate selected wordlines to generate data from the memory module.

However, in the final wordline decode stage, defects in the wordline selected by the address may cause the intended subarray of cells to fail, and thus the data to be corrupt. Among the available techniques used to avoid wordline defects, wordline/bitline redundancy control is perhaps the most commonly used. In conventional redundancy control, when an address points to a wordline found to contain a defect, a mechanism within the final decode stage causes a different wordline to be selected. In high performance memory cases, shift registers, or other similar devices, are employed in the final decode stage to accomplish this "shifting" of the selected wordlines. Multiple shift registers are usually employed, one for each of the wordlines found in the final decode stage. For example, Bit 1 is programmed in the shift register, and the corresponding wordline is shifted by a steering circuit. The steering circuit is usually a multiplexer (MUX). If 2 adjacent wordlines need to be fixed by a one-bit shift scheme, one is shifted up and the other is shifted down. By shifting the wordline, the defective wordline originally selected is bypassed altogether. In addition, for defects found in bitlines, write and read paths are shifted to bypath a defective bitline, just as is done for defective wordlines.

Unfortunately, conventional shifting techniques found in the existing art are not without their problems. For example, in techniques where shifting is accomplished in the decoding stage of the addresses, a large amount of logic is typically required in order to overcome defects detected in wordlines by employing redundant wordlines. Those who are skilled in the art understand that increasing the amount of logic not only increases the cost of devices, but also increases the complexity of the circuits involved. Furthermore, as the logic employed to achieve a desired result is increased, more time to reach that result is required. Of course, increasing delay time usually slows the overall operation of the device.

In other approaches, multiple shift registers are coupled together in a series connection, and then coupled to the multiple wordlines found in the decoder. However, with a series connection between all of the shift registers, when the defective wordlines are adjacent, one of the wordlines is typically set down and the other is set up. Unfortunately, with this configuration, at least a 3:1 multiplexer must be employed to allow the adjacent wordline fix, which usually results in a heavier, more complex circuit. Moreover, the stacked layout of the series-coupled registers may result in wire-crossing when overcoming multiple defective non-adjacent wordlines. More specifically, this is the case because "jumping" some of the series-coupled shift registers associated with the non-adjacent defective wordlines is typically required. Accordingly, a need exists for a decoder for use with high frequency deep pipeline memory systems capable of overcoming wordline defects without suffering from the deficiencies found in conventional decoders.

SUMMARY OF THE INVENTION

A decoder for use in wordline/bitline redundancy control is disclosed. In one aspect, the decoder includes first and second wordlines respectively coupled to redundant first and second wordlines, where the first and second wordlines are configured to be activated based on decoded first and second addresses. In addition, the decoder includes first and second shift registers respectively coupled to the redundant first and second wordlines, where each is configured to respectively activate the redundant first and second wordlines when the first or second wordlines contain a defect. In addition, a method of selecting wordlines for use in wordline/bitline redundancy control and a wordline decoder having redundancy control capabilities are also disclosed.

BRIEF DESCRIPTION OF THE DRAWINGS

The invention may be understood by reference to the following description taken in conjunction with the accompanying drawings, in which like reference numerals identify similar elements, and in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, some details have been omitted inasmuch as such details are not considered necessary to obtain a complete understanding of the present invention, and are considered to be within the understanding of persons of ordinary skill in the relevant art.

Figure 1:
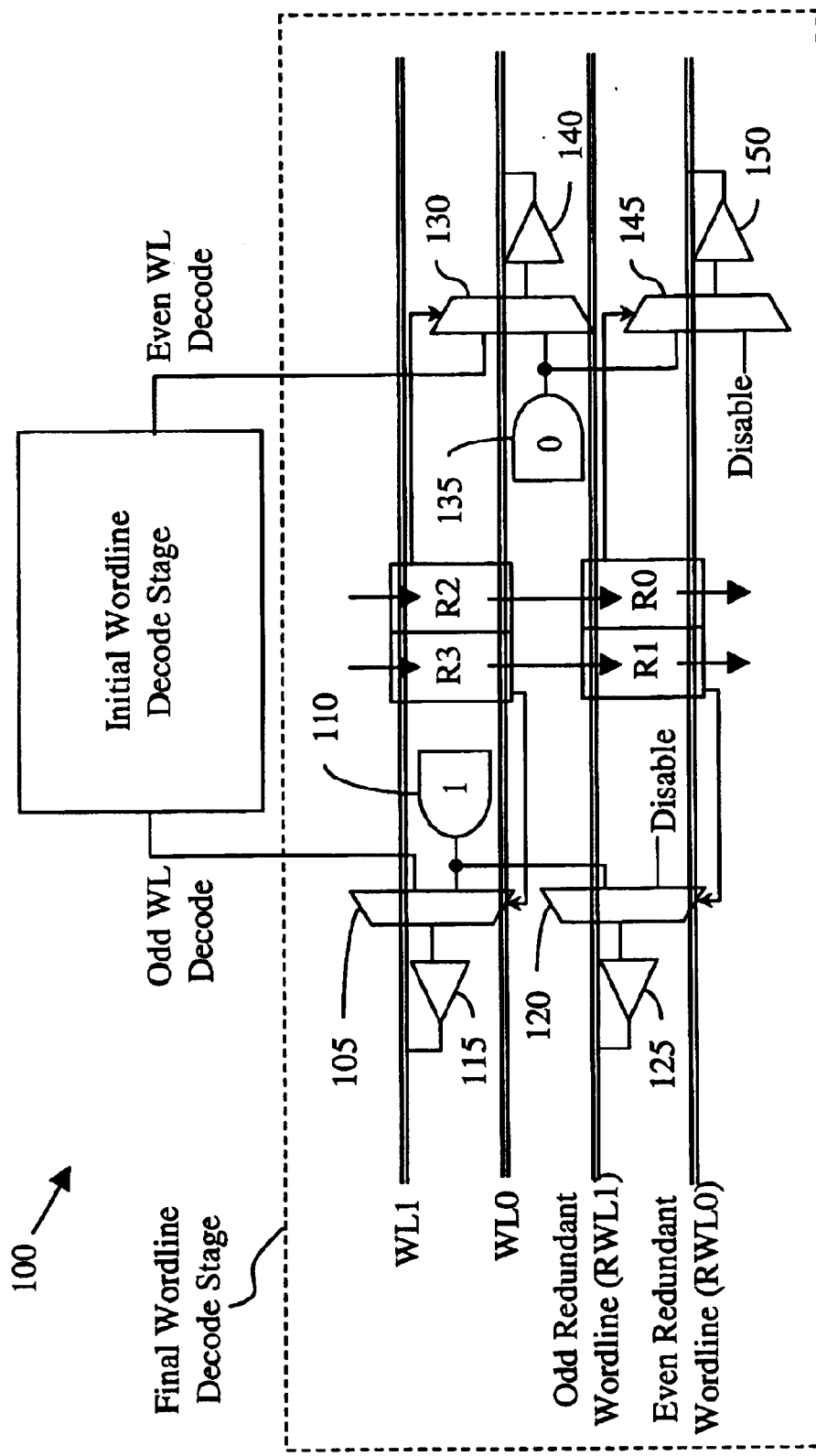
FIG. 1 is a diagram of one embodiment of a decoder for use in wordline/bitline redundancy control.

Turning now to FIG. 1, illustrated is one embodiment of a decoder 100 for use in wordline/bitline redundancy control. As shown, the decoder 100 includes an initial wordline decode stage and a final wordline decode stage. In the initial wordline decode stage, addresses for specific wordlines to be activated are decoded. More specifically, in accordance with the principles disclosed herein, the initial decode stage of a decoder constructed according to the present invention divides the addresses into specific groups, such as odd and even groups. In the final wordline decode stage of the proposed decoder, the wordlines activated based on the addresses are also divided into the same specific groups. The addresses cause first and second wordlines to be activated, thus activating or deactivating specific cells in the subarray of an SRAM or other type of high frequency deep pipeline memory device. Other types of memory systems may also be employed, including L1 and L2 caches.

Additionally, although the invention is described herein in terms of odd and even grouped wordlines, the invention is not so limited. For example, if odd and even wordlines are viewed as simply first and second wordlines, redundant wordlines for either need not only be the next available odd or even wordlines. Rather, redundant wordlines may be employed from every third wordline, every fourth wordline, etc. As a result, the invention provides the capability of shifting or "jumping" a predetermined number of wordlines to find a redundant wordline. Thus, for simplicity, the disclosure herein discusses the invention in terms of odd and even grouped wordlines, however the invention is not intended to be so limited.

Looking more specifically at the decoder 100 of FIG. 1, the final decode stage of the decoder 100 includes an odd wordline WL1 and an even wordline WL0. In addition, the decoder 100 includes a redundant odd wordline RWL1 and a redundant even wordline RWL0. Those who are skilled in the art will understand that the redundant odd wordline RWL1 may be an alternative wordline than that selected by a decoded odd address when the odd wordline WL1 contains a defect. Likewise, the redundant even wordline RWL0 may be an alternative wordline than that selected by a decoded even address when the even wordline WL0 contains a defect.

FIG. 1 also includes odd, second, third, and fourth shift registers R0, R1, R2, and R3. As indicated by their designation, shift registers R0 and R2 are even and second even shift registers, and shift registers R1 and R3 are odd and second odd shift registers, respectively. Advantageously, the registers R0, R1, R2, R3 are configured to receive a shift bit should either or both the odd and even wordlines WL1, WL0 need to be shifted to the redundant wordlines RWL0, RWL1 because of defects detected in the original wordlines WL0, WL1.

Also as illustrated, the odd and even shift registers R0, R1, R2, R3 may be coupled side-by-side, rather than the series connection typically found in conventional decoders. Although such a configuration is not required, the side-by-side layout of odd and even registers R0, R1, R2, R3 allows a direct path between odd registers R1, R3 without the need to "jump over" even registers R0, R2 when shifting non-adjacent wordlines. Similarly, a direct path between even registers R0, R2 is provided without the need to jump over odd registers R1, R3. By eliminating the need to jump over registers, the preferred embodiment of the proposed decoder avoids the wire-crossing that typically occurs with a series connection between both odd and even shift registers when non-adjacent wordlines are found to have defects. The function of the odd and even shift registers R0, R1, R2, R3 is described in greater detail below.

Also illustrated in FIG. 1 is a first odd steering circuit 105. Advantageously, steering circuits employed in the use of the present invention may include a multiplexing circuit, however, the invention is not so limited. As shown, input to the odd steering circuit 105 are an odd wordline decode signal and an output of an odd NAND gate 110. The output of the steering circuit 105 is input to a first odd wordline driver 115, which is then coupled to the odd wordline WL1. If no shifting is required, e.g., no defect in the odd wordline WL1 has been detected, then the odd shift registers R1, R3 do not shift to the redundant odd wordline RWL1. Since no shifting is required, the output of the odd NAND gate 110, which provides the final decoded odd address, is selected by the steering circuit 105 and sent to the first odd wordline driver 115. The first odd wordline driver 115 may then activate the odd wordline WL1 for use in providing conductivity between cells (not illustrated) in an SRAM module and the bitlines (not illustrated) associated with those cells.

While the steering circuit 105 selects the addressed wordline, a second odd steering circuit 120 also receives an input from the odd NAND gate 110, as well as a disable signal. Since no defect was found, and thus shifting to the redundant odd wordline RWL1 is not necessary, the second steering circuit 120 selects the disable signal. As a result, the second steering circuit 120 does not activate a second odd wordline driver 125 coupled to the redundant odd wordline RWL1, thus preventing the activation of the redundant odd wordline RWL1 in place of the odd wordline WL1.

A similar result occurs when no shifting is required because of the lack of a defect in the even wordline WL0. Since no shift is required by the even shift registers R0, R2, a first even steering circuit 130, which receives an even wordline decode signal and an output of a second NAND gate 135, selects the output of the second NAND gate 135. The steering circuit 130 then sends the output of the second NAND gate 135, which provides the decoded even address, to a first even wordline driver 140, which is coupled to the even wordline WL0. The first even wordline driver 140 may then activate the even wordline WL0 for similar use in an SRAM module. Also as before, since no defect in the even wordline WL0 has been detected, the even redundant wordline RWL0 is not activated in place of the even wordline WL0. Thus, a second even steering circuit 145, which receives inputs from the second NAND gate 135, as well as a disable signal, is also disabled by selecting the disable signal. As a result, the even steering circuit 145 does not activate a second even wordline driver 150 coupled to the redundant even wordline RWL0.

When a defect is detected in the odd wordline WL1, the decoder 100 functions in a different manner, shifting to activate the redundant odd wordline RWL1 in its place. More specifically, when a defect is detected in the odd wordline WL1, the first odd shift register R1 sends a control bit to the second odd steering circuit 120. The odd steering circuit 120 then selects the input from the odd NAND gate 110, rather than the disable signal selected when no defect in the odd wordline WL1 is detected. The output of the odd steering circuit 120 then activates the second odd wordline driver 125, which then activates the redundant odd wordline RWL1.

In addition, in a specific embodiment, the redundant odd wordline RWL1 may actually be a second odd wordline selected using a second decoded odd address if no defect is detected in the first odd wordline WL1. In such an embodiment, when a defect is detected, the use of the second odd wordline RWL1 as a redundant path for the first odd wordline WL1 would cause a further shift to a third odd wordline (not illustrated), since the second odd wordline RWL1 would be activated as a redundancy for the odd wordline WL1. Such shifting to the next available odd wordline would be continued for all later decoded odd addresses. Moreover, redundant wordlines may also be provided for each later decoded odd address, which would function in the manner described in detail above. As a result, although FIG. 1 illustrates a decoder having only two odd wordlines and two even wordlines, any number of wordlines may be employed, all of which may be used as redundant wordlines should defects be detected.

When a defect is detected in the even wordline WL0, the even shift registers R0, R2 send a control bit to the second even steering circuit 145. The even steering circuit 145 then selects the input from the second NAND gate 135, rather than the disable signal selected when no defect in the even wordline WL0 is detected. The output of the even steering circuit 145 then activates the second even wordline driver 150, which then activates the redundant even wordline RWL0 for use in the manner described above. In addition, as with the odd redundant wordline RWL1, the even redundant wordline RWL0 may actually be a second even wordline selected using a second decoded even address when no defect is detected in the first even wordline WL0. Thus, when a defect is detected, the use of the second even wordline RWL0 as a redundant wordline for the first even wordline WL0 would cause a further shift to a third even wordline (not illustrated). Such shifting to the next available even wordline would be continued for all later decoded even addresses, in the manner set forth above. Also as before, any number of even wordlines may also be provided, all of which may be used as redundant wordlines should defects be detected.

By providing separate odd and even shift registers for respectively controlling the shifting of wordlines selected using decoded odd and even addresses, the layout of the proposed decoder provides significant advantages over conventional decoders. More specifically, by separating shift registers into odd and even shift registers, large amounts of logic in the final decode stage of the decoder may be avoided. By decreasing the amount of logic, the cost and complexity of the circuit may be decreased. Additionally, the amount of time required for multiple shifting operations may also be decreased. As a result, a more cost-sensitive and faster device may be constructed using the principles disclosed herein.

In addition, the proposed decoder allows odd and even wordline defects to be overcome in an independent manner. This independent nature provides the ability to overcome two adjacent odd or two adjacent even wordline defects simultaneously, which is not typically possible with conventional decoders. Moreover, in embodiments having separate odd and even shift registers coupled side-by-side rather than in series, concern for wire-crossing within the shift registers, which typically occurs when both odd and even numbered shift registers are coupled together in series, is reduced or eliminated by eliminating the need to "jump" over shift registers. Furthermore, the decoder may be employed with virtually any high frequency deep pipeline memory system, while overcoming the deficiencies set forth above, and maintaining the advantages described herein.

Figure 2:
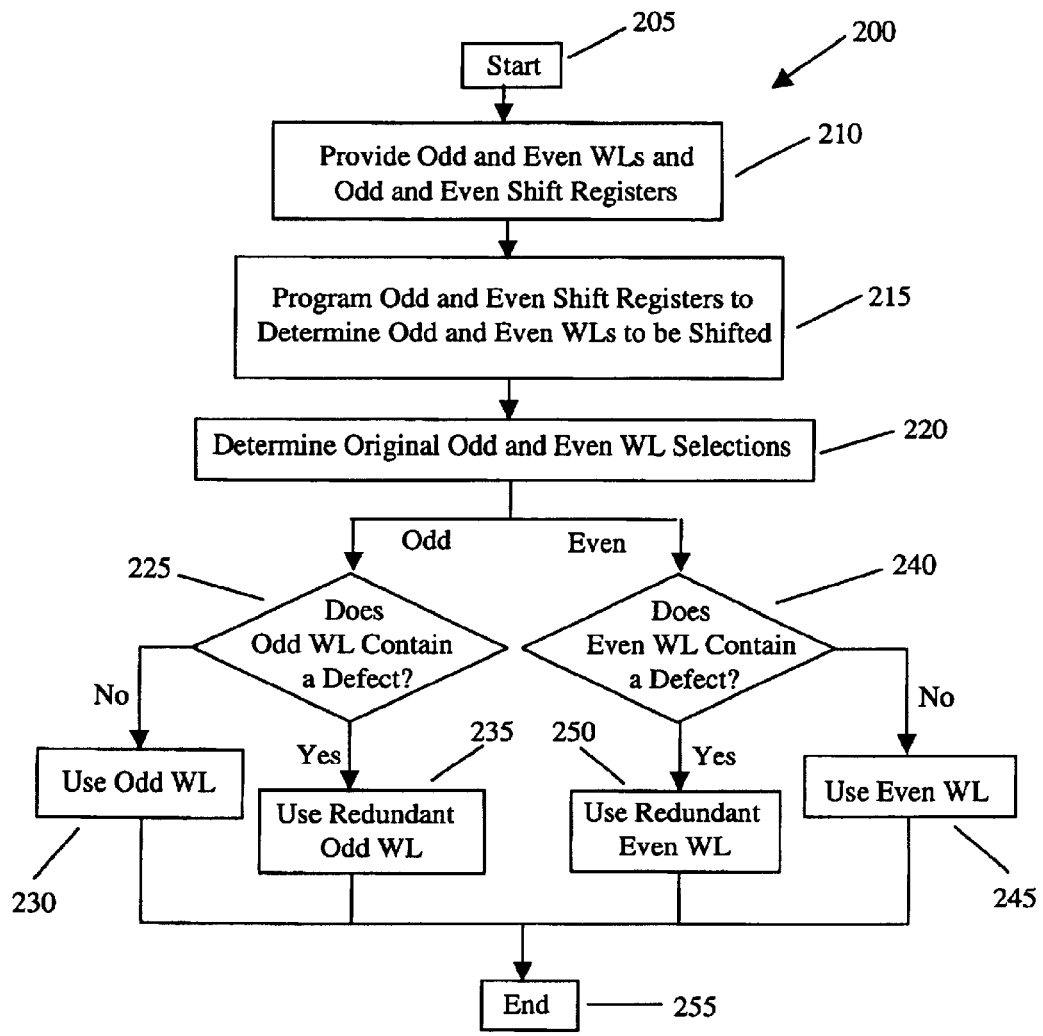
FIG. 2 illustrates a flow diagram of one embodiment of a method of selecting wordlines for use in wordline/bitline redundancy control.

Turning to FIG. 2, illustrated is a flow diagram 200 of one embodiment of a method of selecting wordlines for use in wordline/bitline redundancy control. It should be understood that the flow diagram 200 illustrated in FIG. 2 includes simplified steps in order to illustrate the proposed method, and is not intended to be limited to any particular number of steps. The method begins at a start step 205. At a step 210, odd and even shift registers are provided for use in carrying out a memory access operation. In addition, odd and even shift registers, corresponding to the odd and even wordlines, are also provided.

At a step 215, shift registers are programmed to determine which wordlines need to be shifted. Any wordlines to be shifted need to have a shift value in their corresponding shift register. The shift register is programmed once at power on. The data is determined based on manufacturing tests. In an exemplary case, the bit string is generated from fuse data. In a step 220, predecoded signals come from the previous stage and are provided to the final decode stage to determine the original wordline selection. Once the determinations at steps 215 and 220 have been made, any defective activated wordlines are jumped or bypassed for the next odd/even wordline if the corresponding shift register contains a value for shift. This portion of the proposed process is illustrated by splitting the flow diagram 200 of FIG. 2 into odd and even portions.

Following the odd side of the flow diagram 200, a decision must be made at a step 225. More specifically, the decision to be made is whether the odd wordline originally selected contains a defect that can detrimentally affect the function of the memory module. If a defect is not present in the odd wordline, then the process moves to a step 230, where the odd wordline originally selected is employed. The process then ends at an end step 255. However, if the determination is made that the odd wordline does contain a defect, the process moves to a step 235, where the redundant odd wordline is employed. Afterwards, the process then moves to the end step 255.

Following the even side of the flow diagram 200, a decision must also be made at a step 240. More specifically, the decision to be made is whether the even wordline originally selected contains a defect that will affect the function of the memory module. Similar to the odd side of the flow diagram 200, if a defect is not present in the even wordline, then the process moves to a step 245, where the even wordline originally selected is employed. The process then moves to the end step 255. However, if the determination in step 240 is that the even wordline does contain a defect, the process moves to a step 250, where the redundant even wordline is employed. After this step, the process then moves to the end step 255. Those who are skilled in the art will understand that the practice of the proposed method is not limited to the specific steps set forth in FIG. 2. Thus, a greater or lesser number of steps may be employed. Additionally, steps having greater or lesser detail than those illustrated in FIG. 2 may also be employed to advantage.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A decoder for use in wordline/bitline redundancy control, comprising:
    first and second wordlines configured to be activated based on decoded first and second addresses;
    redundant first and second wordlines respectively coupled to the first and second wordlines; and
    first and second shift registers respectively coupled to the redundant first and second wordlines and configured to respectively activate the redundant first and second wordlines when the first or second wordlines contain a defect.

2. The decoder as recited in claim 1, further comprising first and second wordline drivers respectively coupled to the first and second wordlines and configured to activate the first and second wordlines when the first or second wordlines are free of defects.

3. The decoder as recited in claim 2, further comprising first and second steering circuits respectively coupled to the first and second wordline drivers and configured to select a signal to cause the first and second wordline drivers to activate the first and second wordlines.

4. The decoder as recited in claim 3, further comprising first and second logic gates respectively coupled to the first and second steering circuits and configured to provide the decoded first and second addresses.

5. The decoder as recited in claim 1, further comprising redundant first and second wordline drivers respectively coupled to the redundant first and second wordlines and configured to activate the redundant first and second wordlines when the first or second wordlines contain a defect.

6. The decoder as recited in claim 5, further comprising redundant first and second steering circuits respectively coupled to the redundant first and second wordline drivers and configured to select a signal to cause the redundant first and second wordline drivers to activate the redundant first and second wordlines.

7. The decoder as recited in claim 1, wherein the first and second wordlines are odd and even wordlines, respectively, and the redundant first and second wordlines are redundant odd and even wordlines, respectively.

8. A method of selecting wordlines for use in wordline/bitline redundancy control, comprising:
coupling first and second wordlines to respective redundant first and second wordlines, the first and second wordlines configured to be activated based on decoded first and second addresses; and
activating the redundant first and second wordlines, using first and second shift registers coupled to the respective redundant first and second wordlines, when the first or second wordlines contain a defect.

9. The method as recited in claim 8, further comprising coupling respective first and second wordline drivers to the first and second wordlines and to activate the respective first and second wordlines when the first or second wordlines are free of defects.

10. The method as recited in claim 9, further comprising selecting a signal, using first and second steering circuits coupled to the respective first and second wordline drivers, to cause the first and second wordline drivers to activate the first and second wordlines.

11. The method as recited in claim 10, further comprising providing the decoded first and second addresses using first and second logic gates coupled to the respective first and second steering circuits.

12. The method as recited in claim 8, further comprising activating the first and second redundant wordlines using redundant first and second wordline drivers coupled to the respective redundant first and second wordlines when the first or second wordlines contain a defect.

13. The method as recited in claim 12, further comprising selecting a signal, using redundant first and second steering circuits coupled to the respective redundant first and second wordline drivers, to cause the redundant first and second wordline drivers to activate the redundant first and second wordlines.

14. The method as recited in claim 8, wherein coupling first and second wordlines to respective redundant first and second wordlines includes coupling odd and even wordlines to respective redundant odd and even wordlines, and activating the redundant first and second wordlines using first and second shift registers, and comprises activating the redundant odd and even wordlines using odd and even shift registers.

15. A wordline decoder having redundancy control capabilities, comprising:
circuitry comprising an initial wordline decode stage; and
circuitry comprising a final wordline decode stage, comprising:
circuitry comprising first and second wordlines coupled to respective redundant first and second wordlines, each first and second wordlines configured to be activated based on decoded first and second addresses; and
circuitry comprising first and second shift registers coupled to the respective redundant first and second wordlines and each configured to activate the respective redundant first and second wordlines when the first or second wordlines contain a defect.

16. The decoder as recited in claim 15, further comprising first and second wordline drivers coupled to the respective first and second wordlines and configured to activate the first and second wordlines when the first or second wordlines are free of defects.

17. The decoder as recited in claim 16, further comprising first and second steering circuits coupled to the respective first and second wordline drivers and configured to select a signal to cause the first and second wordline drivers to activate the first and second wordlines.

18. The decoder as recited in claim 17, further comprising first and second logic gates coupled to the respective first and second steering circuits and configured to provide the decoded first and second addresses.

19. The decoder as recited in claim 15, further comprising redundant first and second wordline drivers coupled to the respective redundant first and second wordlines and configured to activate the redundant first and second wordlines when the first or second wordlines contain a defect.

20. The decoder as recited in claim 19, further comprising redundant first and second steering circuits coupled to the respective redundant first and second wordline drivers and configured to select a signal to cause the redundant first and second wordline drivers to activate the redundant first and second wordlines.

* * * * *